United States Patent [19]
Fukuyo et al.

[11] Patent Number: 5,456,815
[45] Date of Patent: Oct. 10, 1995

[54] SPUTTERING TARGETS OF HIGH-PURITY ALUMINUM OR ALLOY THEREOF

[75] Inventors: Hideaki Fukuyo; Susumu Sawada; Masaru Nagasawa, all of Kitaibaraki, Japan

[73] Assignee: Japan Energy Corporation, Tokyo, Japan

[21] Appl. No.: 364,073

[22] Filed: Dec. 27, 1994

Related U.S. Application Data

[63] Continuation of Ser. No. 131,509, Oct. 4, 1993, abandoned.

[30] Foreign Application Priority Data

Apr. 8, 1993 [JP] Japan .................................. 5-104942

[51] Int. Cl.⁶ .................................................. C23C 14/34
[52] U.S. Cl. ........................ 204/298.13; 204/298.12; 148/688
[58] Field of Search ................... 204/192.12, 298.12, 204/298.13; 148/691, 692, 695, 696, 415, 688

[56] References Cited

U.S. PATENT DOCUMENTS 5,087,297  2/1992  Poliquen ........................ 204/298.13

FOREIGN PATENT DOCUMENTS 63-145771  6/1988  Japan ................................ 204/298.13
63-312975  12/1988  Japan .
2-12167  1/1990  Japan .
3-2369  1/1991  Japan .

OTHER PUBLICATIONS

"Crystallographic target effect in magnetron sputtering" Wickersham, Jr. J. Vac. Sci. Tech. A5(4) Jul./Aug. 1987.

*Primary Examiner*—R. Bruce Breneman
*Assistant Examiner*—Rodney G. McDonald
*Attorney, Agent, or Firm*—Panitch Schwarze Jacobs & Nadel

[57] ABSTRACT

A sputtering target of a high-purity Al or Al alloy having (1) a target crystal structure as a recrystallization structure and average grain diameters in various portions of 500 μm or less, with dispersions within ±15%, and (2) a {200} crystalline orientation content ratio on the sputtering surface of at least 0.35 in various portions of the target, with dispersions within ±15%, said {200} crystalline orientation content ratio being defined by the following formula:

$$\frac{I_{\{200\}}/47}{I_{\{111\}}/100 + I_{\{200\}}/47 + I_{\{220\}}/22 + I_{\{311\}}/24}$$

where $I_{\{200\}}$, $I_{\{111\}}$, $I_{\{220\}}$ and $I_{\{311\}}$ are peak strengths for (200), (111), (220) and (311) crystal planes, respectively, as obtained X-ray diffraction method. Simultaneous realization of (1)+(2) is desirable. For these purposes, uniform warm or cold working to a desired final geometry below the recrystallization temperature must be followed by uniform heat treatment throughout the target at the recrystallization temperature of the material to finish the recrystallization.

2 Claims, 1 Drawing Sheet

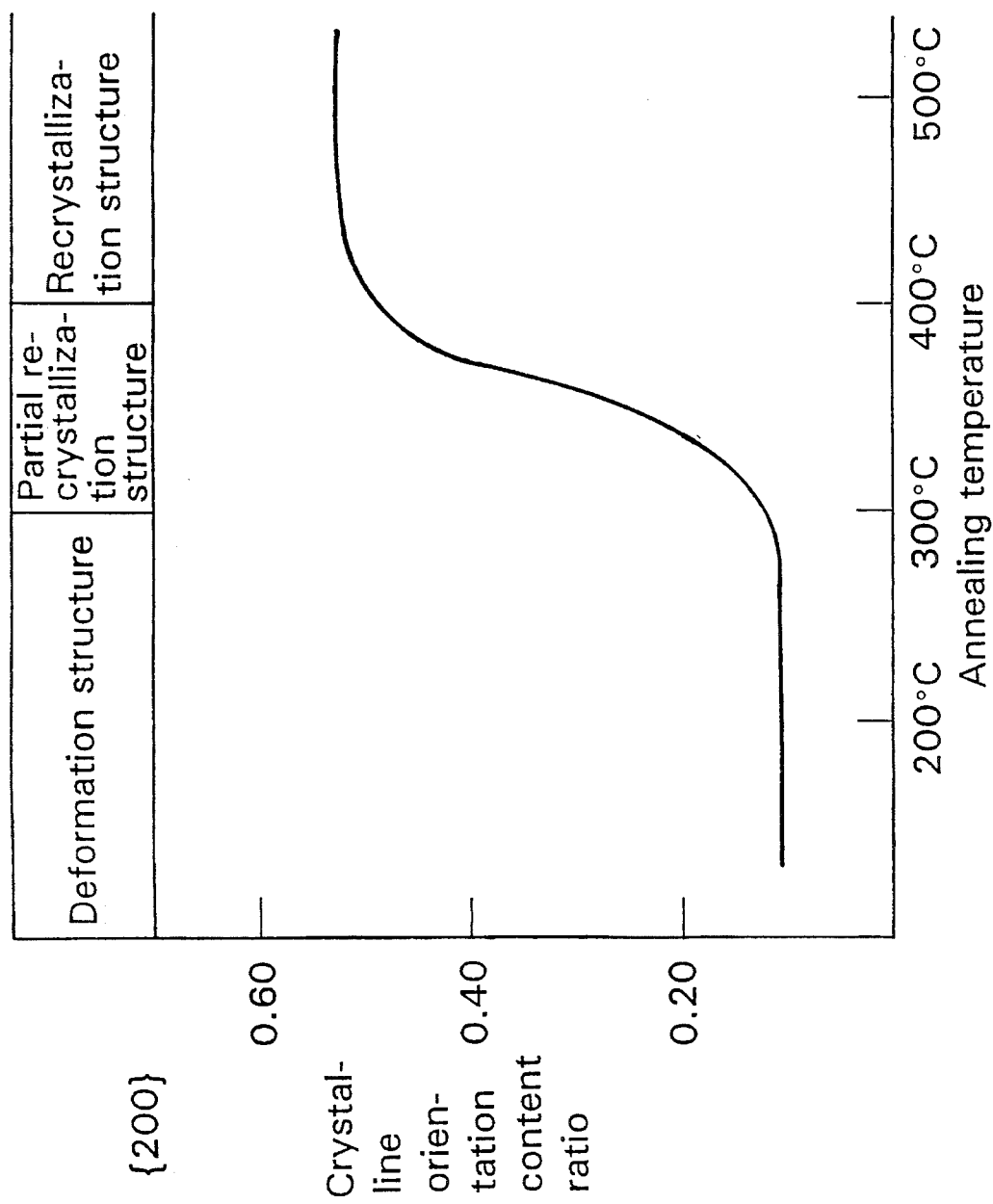

SPUTTERING TARGETS OF HIGH-PURITY ALUMINUM OR ALLOY THEREOF

This is a continuation of application Ser. No. 08/131,509, filed Oct. 4, 1993 now abandoned.

BACKGROUND OF THE INVENTION

This invention relates to sputtering targets of high-purity aluminum or an alloy thereof. More particularly, this invention relates to sputtering targets of high-purity aluminum or an alloy thereof whose average crystal grain diameter and/or crystalline orientation is specified from an angle different from that of the prior art so as to meet the possible future requirements of semiconductor devices.

A sputtering target is usually a disk-shaped sheet which serves as a sputtering source to form electrodes, gates, wirings, elements, insulating film, protective film or the like by sputtering on substrates of various semiconductor devices. Impingement of accelerated particles upon the surface of the target causes, by momentum exchange, the emission of the atoms constituting the target to the space and their deposition on an oppositely located substrate. Sputtering targets that have been typically used include the targets of Al and Al alloys, refractory metals and their alloys (e.g., W, Mo, Ti, Ta, Zr, Nb, and their alloys such as W—Ti), and metal silicides (e.g., $MoSi_x$, $WSi_x$, and $NiSi_x$).

Important among those targets are the targets of Al and Al alloys for forming Al wirings. Thin films of Al have also been used in the reflective surfaces of compact disks and optomagnetic disks.

In recent years the wafer size has been increased from 6 in. to 8 in. in diameter and the width of circuit wirings has become finer to 0.5 µm or less. Following these trends in the art, the uniformity required of thin films formed by sputtering on the wafers is becoming ever stricter so that desired characteristics of resulting fine wires can be secured. Specifically, the dispersion of film thickness distribution was formerly limited to a standard deviation ($\sigma$) of 5% or less, but now it is limited even to 5% or less in terms of the three fold value ($3\sigma$) of the standard deviation. With these in view, investigations are under way on sputtering equipment and conditions, and on targets, directed to the improvement in the uniformity of film thickness. It has been shown that conventional targets obtained hitherto are of such quality that the dispersion and variation of film thickness distribution are still large from target to target and during services of the same target, and they apparently fail to satisfy the afore-said standard ($3\sigma < 5\%$).

In connection with the dispersion of film thickness distribution which is attributable to the quality of the Al or Al alloy target used, it is presumed that, because the surface and internal crystal structure (i.e., the crystal grain diameter, crystalline orientation, etc.) materially influences the emission of atoms from the target, the non-uniformity of crystal structure of the target has a significant effect upon the thickness distribution of the thin film formed by sputtering on a wafer. In view of this, it has been attempted with high-purity aluminum or alloy target to make it as fine in crystal structure as possible and control certain crystal planes for crystalline orientations.

For example, a paper "Crystallographic target effects in magnetron sputtering" by C. E. Wickersharm, Jr. which was carried in J. Vac. Sci. Technol. A. Vol. 5, No. 4, Jul/Aug 1987, pp. 1755–1768, reports on the influence of crystalline orientation on the uniformity of sputtered thin films. Japanese Patent Application Public Disclosure No. 312975/1988 describes, in view of the fact that a thin film of aluminum formed by sputtering on a wafer shows such a thickness distribution is thick in the center and thin along the periphery, an aluminum sputtering target in which the crystalline orientation content ratio {220}/{200} is larger in the center than in the periphery. Japanese Patent Application Public Disclosure No. 15167/1990 describes an aluminum sputtering target having the (111) crystal plane accounting for at least 50% of the surface area. Patent Application Public Disclosure No. 2369/1991 proposes decreasing the crystalline orientation intensity ratio {100}/{110} gradually from the target surface toward the innermost region so as to overcome the problem of magnetron sputtering, i.e., the deterioration of film thickness distribution due to a change in the direction of atom emission concurrently with the formation of a ring-shaped groove on the surface along the path of rotation of the magnet with the consumption of the aluminum target. Patent Application Public Disclosure No. 10709/1991 discloses an aluminum target characterized in that the surface to be sputtered has a crystalline orientation content ratio {220}/{200} of 0.5 or more. Further, Patent Application Publication No. 246170/1992 teaches an aluminum target having a grain size of 2 mm or less and a <110> fiber structure with a fiber axis having an X-ray diffraction intensity of at least 20 times the random value.

Still, these targets are unable to satisfy the specification that the threefold value ($3\sigma$) of the standard deviation be 5% or less.

OBJECT OF THE INVENTION

The object of this invention is to establish a technique of improving the sputtering target to a level such that the uniformity of Al thin films formed by sputtering, in terms of the threefold value ($3\sigma$) of the standard deviation, comes within the range of 5% or less.

SUMMARY OF THE INVENTION

With the object of improving the uniformity of thin films formed by sputtering on wafers, we have studied the effects of the crystal structure, grain diameter, and crystalline orientation upon the film thickness distribution. It has now been found, as the result, that an excellent uniformity of film thickness distribution that was never realized before can be achieved by (1) making the crystal structure of a target a recrystallization structure and controlling the absolute values of average grain diameters in various portions of the target and the dispersion of the average grain diameter in various portions relative to the average grain diameter of the target as a whole to predetermined levels and (2) adjusting the absolute value and dispersion of the {200} crystalline orientation content ratio, i.e., the proportion of the crystalline orientation {200} to the total of all the crystalline orientations {111}, {200}, {220}, and {311}.

On the basis of the above discovery, the present invention provides:

(1) a sputtering target of a high-purity aluminum or an alloy thereof characterized in that the crystal structure of the target is a recrystallization structure, the average grain diameters in various portions of the target are 500 µm or less, and the grains dispersed in the various portions of the target have an average grain diameter within ±15% of the average grain diameter of the grains in the target as a whole, (2) a sputtering target of a high-purity aluminum or an alloy thereof characterized in that the {200} crystalline orientation content ratio as determined by X-ray diffraction method on the sputtering surface of the target is at least 0.35 in various portions of the target, and the {200} crystalline orientation content ratio in the various portions of the target is within ±15% of the average {200} crystalline orientation content ratio for the target as a whole, and (3) a sputtering target of a high-purity aluminum or an alloy thereof characterized in that the crystal structure of the target is a recrystallization structure, the average grain diameters in various portions of the target are 500 μm or less, and the grains dispersed in the various portions of the target have an average grain diameter within ±15% of the average grain diameter of the grains in the target as a whole, and the {200} crystalline orientation content ratio as determined by X-ray diffraction method on the sputtering surface of the target is at least 0.35 in various portions of the target, and {200} crystalline orientation content ratio in the various portions of the target is within ±15% of the average {200} crystalline orientation content ratio for the target as a whole.

The expression "{200} crystalline orientation content ratio" used herein is defined using the X-ray diffraction peak intensity from sets of aluminum alloy, (200), (111), (220) and (311), each normalized by the randomly oriented powder diffraction peak intensity of corresponding plane, as shown in the following formula:

$$\frac{I_{\{200\}}/47}{I_{\{111\}}/100 + I_{\{200\}}/47 + I_{\{220\}}/22 + I_{\{311\}}/24}$$

where $I_{\{200\}}$, $I_{\{111\}}$, $I_{\{220\}}$ and $I_{\{311\}}$ are peak strengths for (200), (111), (220) and (311) crystal planes, respectively, as obtained X-ray diffraction method.

BRIEF DESCRIPTION OF THE DRAWING

The single FIGURE, FIG. 1, is a graph showing the relations among the {200} crystalline orientation content ratio, annealing temperature, and target structure.

DETAILED DESCRIPTION OF THE INVENTION

The crystal structure of the target is specified to be a recrystallization structure since the latter attains improved thermal stability over the crystal structure. When the target is in a worked or wrought structure, the temperature rise of the target during sputtering causes recovery of the target crystal structure or partial recrystallization of the structure, which in turn results in variation of film thickness distribution with time due to the changes in the target crystal structure. The average grain diameters in various portions of the target are limited to 500 μm or less, because the coarse grains exceeding 500 μm in average grain diameter exhibit remarkable differences in the tendencies of atom emission from the individual grains. The dispersions of average grain diameters in various portions relative to the average grain diameter of the target as a whole are restricted to ±15% or less, in that dispersions beyond ±15% make the differences in sputtering rates of the various portions of the target remarkable, leading to uneven film thickness distribution. The average grain diameters in various portions of the target are preferably 300 μm or less.

Principal crystalline orientations that are determined by the X-ray diffraction as normally appearing on the sputtering surface of an aluminum target are {111}, {200}, {220}, and (311). Of these, the orientation {200} is of particular importance in that its proportion to the total crystalline orientation present serves as a measure of the availability of a thermally stable crystal structure, albeit the reason is to be fully clarified yet. It is thus necessary that the {200} orientation content ratio is 0.35 or more throughout the various portions of the target. Also, the {200} crystalline orientation content ratio in the various portions of the target is within ±15% of the average {200} crystalline orientation content ratio for the whole target. "The {200} crystalline orientation content ratio" is defined herein using the X-ray diffraction peak intensity from each of the most common crystallographic plane sets of aluminum alloy, (200), (111), (220) and (311), each normalized by the randomly oriented powder diffraction peak intensity of corresponding plane, as shown in the following formula:

$$\frac{I_{\{200\}}/47}{I_{\{111\}}/100 + I_{\{200\}}/47 + I_{\{220\}}/22 + I_{\{311\}}/24}$$

where $I_{\{200\}}$, $I_{\{111\}}$, $I_{\{220\}}$ and $I_{\{311\}}$ are peak strengths for (200), (111), (220) and (311) crystal planes, respectively, as obtained X-ray diffraction method.

If the crystalline orientation content ratios in various portions of a target is less than 0.35, the crystal structure of the target is a thermally unstable worked structure or a still unstable partial recrystallization structure, as is manifest from the relationship between the crystal structure and the crystalline orientation content ratio illustrated in FIG. 1. A crystalline orientation content ratio of 0.35 or above gives a stable partial recrystallization structure or a recrystallization structure. If the dispersions of the {200} crystalline orientation content ratios in various portions to the total average {200} crystalline orientation content ratio are more than ±15%, the nonuniformity of the sputtering rates of the various portions becomes pronounced and uneven film thickness distribution results.

The term "high-purity aluminum" as used herein to designate a material for the sputtering targets of the invention means an aluminum of a purity of 4N (99.99%) or more, and its "alloy" means the high-purity aluminum containing 10 wt. % or less of one or two or more elements, such as Si, Cu, Ti, Ge, Cr, and Mo, that are usually added to it to provide a sputtering target.

Qualitative adjustments of the targets according to the invention can be made by a combination of plastic working such as rolling or forging, and heat treatment. Actual degrees of adjustments cannot be generically defined because they depend largely upon the purity or alloy composition of the target material, the cast structure, the methods of plastic working and heat treatment, and other parameters. However, once those parameters including the target material, cast structure, and the methods of plastic working and heat treatment to be applied are identified, it becomes possible to find the proper conditions for plastic working and heat treatment to obtain the desired quality.

For example, the set of conditions, i.e., the average grain diameters of 500 μm or less in various portions of a target, and grains in the various portions of the target having an average grain diameter within ±15% of the average grain diameter for the grains in the target as a whole, is realized in the following way. An aluminum (alloy) ingot is hot worked above the recrystallization temperature of the material to destroy its cast structure and make the crystal grain size uniform. To impart a final, uniform, fine recrystallization texture, uniform warm or cold working of the target material is conducted below the recrystallization temperature to a desired final shape, and then the target is subjected to a uniform heat treatment in the recrystallization temperature range for the particular material so as to finish the recrystallization. Here the recrystallization temperature depends mainly on the purity and composition of the material, added alloying components, and the state of precipitation of the compound.

In order to attain the conditions of the {200} crystalline orientation content ratio of 0.35 or more throughout the various portions of the target and {200} crystalline orientation content ratios in the various portions of the target within ±15% of the {200} crystalline orientation content ratio for the target as a whole, it is necessary that, among the working parameters, the working ratio be set to 1.5 or more, and warm or cold working be done uniformly and thereafter the target be heat-treated evenly in the recrystallization temperature range of the material to finish the recrystallization. Here if the working ratio is less than 1.5, it is impossible to attain a uniform crystalline orientation content ratio corresponding to the recrystallization structure after the heat treatment.

The two conditions of average grain diameters and {200} crystalline orientation content ratios can be realized simply by adopting a working method that satisfies the both requirements.

For the determination of the {200} crystalline orientation content ratio, the test specimen is electrolytically polished or otherwise processed to remove chemically the deformed layer from the surface, and the intensities of the diffraction lines corresponding to the individual crystalline orientations are measured by an X-ray diffractometer. Specifically, the X-ray diffraction peak intensity from each of the most common crystallographic plane sets of aluminum alloy, (200), (111), (220) and (311), is measured and normalized by the randomly oriented powder diffraction peak intensity of corresponding plane, that is the intensity values of the diffraction lines thus obtained are corrected with the relative intensity ratios of the diffraction lines of the respective crystalline orientations (refer to JCPDS Card in Table 1), and from the corrected intensities is calculated the crystalline orientation content ratio in the {200} plane. Calculations of the {200} crystalline orientation content ratios are given in Table 1.

The determination of the average grain diameters of various portions is performed in conformity with procedure described in Japan Industrial Standard H-0501. JIS H-0501 provides an visual method for designating grain size.

TABLE 1

| crystal orientation | Relative intensity ratio (JCPDS Card) | Measured intensity ratio | Corrected intensity |
|---|---|---|---|
| {111} | 100 | A | A/100 |
| {200} | 47 | B | B/47 |
| {220} | 22 | C | C/22 |
| {311} | 24 | D | D/24 |

EXAMPLES

An example of the present invention and comparative examples are given below. Ingots of aluminum alloy (Al-3.0 wt. % Cu) were subjected to plastic working and heat treatment to give targets A, B, and C of the crystal structures and crystalline orientations shown in Table 2. Target A conformed to the present invention and targets B and C were comparative examples. The targets were in the form of disk-shaped sputtering targets about 320 mm in diameter and about 12 mm thick. Targets A, B, and C were made under the following conditions.

(A) Target A

An Al-3.0 wt. % Cu ingot was hot-worked at 520° C., warm-worked at 275° C. in a working ratio of 2.0, and then heat-treated uniformly throughout at 470° C. for one hour.

(B) Target B

An Al-3.0 wt. % Cu ingot was hot-worked at 520° C., warm-worked at 275° C. in a working ratio of 2.0, and then heat-treated using a heat-treating oven which had a narrow soaking temperature distribution at 420° C. for one hour.

(C) Target C

An Al-3.0 wt. % Cu ingot was hot-worked at 500° C., warm-worked at 275° C. in a working ratio of 1.8 for one half of one side of the work as forged and in a working ratio of 1.3 for the remainder half, and then heat-treated uniformly throughout at 450° C. for one hour.

Table 3 shows the dispersions of the crystal gain diameters and of {200} crystalline orientation content ratios calculated from the measurement results of Table 2.

TABLE 2

Crystal grain diameter (upper row in μm) and {200} crystalline orientation content ratio (lower row)

| Target | Periphery 1 | Periphery 2 | Periphery 3 | Periphery 4 | Center | Average |
|---|---|---|---|---|---|---|
| A | 240 | 235 | 253 | 251 | 246 | 245 |
|   | 0.48 | 0.52 | 0.55 | 0.46 | 0.43 | 0.48 |
| B | 95 | 87 | 91 | 100 | 180 | 111 |
|   | 0.55 | 0.52 | 0.46 | 0.49 | 0.44 | 0.49 |
| C | 230 | 243 | 131 | 126 | 137 | 173 |
|   | 0.11 | 0.09 | 0.51 | 0.43 | 0.49 | 0.32 |

TABLE 3

| Target | Periphery 1 | Periphery 2 | Periphery 3 | Periphery 4 | Center |
|---|---|---|---|---|---|
| | Despersion of crystal grain diameter | | | | |
| A | 2 | 4 | 3 | 2 | 0.4 |
| B | 14 | 21 | 18 | 9 | 62 |
| C | 32 | 40 | 24 | 27 | 20 |
| | Dispersion of {200} crystalline orientation content ratio (%) | | | | |
| A | 0 | 8 | 14 | 4 | 10 |
| B | 12 | 6 | 6 | 0 | 10 |
| C | 65 | 71 | 59 | 34 | 53 |

These targets were set each in a magnetron sputtering device to form a film on an 8-in. wafer substrate. Table 4 shows the standard deviation (σ) of film thickness distribution of the sputter film formed of each target. The film thickness distribution was calculated from the sheet resistance values measured at 121 points of each wafer by the four point probe method. As can be seen from Table 3, while both targets A and B had uniform {200} crystalline orientation content ratios, target A that had a large average crystal grain diameter of about 250 μm but a uniform grain diameter throughout the target was superior in film thickness uniformity to target B that had a small average grain diameter of about 120 μm but differed in grain diameter between the periphery and the center of the target. The threefold value (3σ) of standard deviation (σ) of target A was 4.05 which is less than 5%, whereas that of target B was 5.04 which slightly more than 5%. Target C that varied in the {200} crystalline orientation content ratio and grain diameter between the left and right half portions of the target exhibited serious unevenness of film thickness. Thus the threefold value (3σ) of standard deviation (σ) of target C was 6.75.

TABLE 4

| Target | A | B | C |
|---|---|---|---|
| Standard deviation of film thickness distribution | 1.35 | 1.68 | 2.25 |

ADVANTAGE OF THE INVENTION

Dispersion and variation of film thickness distribution are effectively decreased with different targets as well as with a single target, and the resulting film stably shows excellent uniformity of film thickness distribution. Consequently, the percentage of defects in circuits, such as of LSI, formed on wafers can be reduced.

What is claimed is:

1. A sputtering target of a high-purity aluminum or an alloy thereof characterized by a {200} crystalline orientation content ratio as determined by an X-ray diffraction method on the sputtering surface of the target; the {200} crystalline content ratio being at least 0.35 in all portions of the target, the {200} crystalline orientation content ratios of any portion of the target being within ±15% of the average {200} crystalline orientation content ratio for the whole target, said {200} crystalline orientation content ratio being defined according to the following formula:

$$\frac{I_{(200)}/47}{I_{(111)}/100 + I_{(200)}/47 + I_{(220)}/22 + I_{(311)}/24}$$

where $I_{(200)}$, $I_{(111)}$, $I_{(220)}$ and $I_{(311)}$ are peak strengths for (200), (111), (220) and (311) crystal planes, respectively, as obtained by the X-ray diffraction method.

2. A sputtering target of a high-purity aluminum or an alloy thereof characterized in having been formed through recrystallization, and comprising grains where the average grain diameter in any portion of the target is 500 μm or less, the grains in any portion of the target having an average grain diameter within ±15% of the average grain diameter for all the grains in the target, and further characterized by a {200} crystalline orientation content ratio as determined by an X-ray diffraction method on the sputtering surface of the target, the {200} crystalline orientation content ratio being at least 0.35 in all portions of the target, the {200} crystalline orientation content ratios of any portion of the target being within ±15% of the average {200} crystalline orientation content ratio for the whole target, said crystalline orientation content ratio defined by the formula:

$$\frac{I_{(200)}/47}{I_{(111)}/100 + I_{(200)}/47 + I_{(220)}/22 + I_{(311)}/24}$$

where $I_{(200)}$, $I_{(111)}$, $I_{(220)}$ and $I_{(311)}$ are peak strengths for (200), (111), (220) and (311) crystal planes, respectively, as obtained by the X-ray diffraction method.

* * * * *